(12) United States Patent
Natali et al.

(10) Patent No.: US 11,217,743 B2
(45) Date of Patent: Jan. 4, 2022

(54) RARE EARTH NITRIDE STRUCTURES AND DEVICES AND METHOD FOR REMOVING A PASSIVATING CAPPING

(71) Applicant: VICTORIA LINK LIMITED, Wellington (NZ)

(72) Inventors: Franck Natali, Porirua (NZ); Benjamin John Ruck, LowerHutt (NZ); Harry Joseph Trodahl, Wellington (NZ); Jay Ross Peng Cheong Chan, Wellington (NZ)

(73) Assignee: VICTORIA LINK LIMITED, Wellington (NZ)

( * ) Notice: Subject to any disclaimer, the term of this patent is extended or adjusted under 35 U.S.C. 154(b) by 0 days.

(21) Appl. No.: 16/465,804

(22) PCT Filed: Dec. 7, 2017

(86) PCT No.: PCT/IB2017/057718
§ 371 (c)(1),
(2) Date: May 31, 2019

(87) PCT Pub. No.: WO2018/104899
PCT Pub. Date: Jun. 14, 2018

(65) Prior Publication Data
US 2020/0028068 A1      Jan. 23, 2020

(30) Foreign Application Priority Data

Dec. 7, 2016   (EP) .................................... 16202663

(51) Int. Cl.
*H01L 43/02*    (2006.01)
*H01F 1/03*     (2006.01)
(Continued)

(52) U.S. Cl.
CPC ........... *H01L 43/02* (2013.01); *H01F 1/0302* (2013.01); *H01L 43/10* (2013.01); *H01L 43/12* (2013.01); *H01L 33/0004* (2013.01)

(58) Field of Classification Search
CPC ......... H01L 43/02; H01L 43/10; H01L 43/12; H01L 33/0004; H01L 21/02664;
(Continued)

(56) References Cited

U.S. PATENT DOCUMENTS 10,043,871 B1 *   8/2018  Natali ............... H01L 21/02439
2015/0203990 A1   7/2015  Dargis et al.
(Continued)

FOREIGN PATENT DOCUMENTS

WO   2015/152736   10/2015
WO   2015/152737   10/2015

OTHER PUBLICATIONS

International Search Report for PCT/IB2017/057718, dated Feb. 23, 2018, 5 pages.
(Continued)

*Primary Examiner* — Cuong B Nguyen
(74) *Attorney, Agent, or Firm* — Nixon & Vanderhye P.C.

(57) ABSTRACT

The present invention concerns a structure or device comprising a rare earth nitride material, and a removable capping for passivating the rare earth nitride material.

7 Claims, 5 Drawing Sheets

(51) Int. Cl.
  *H01L 43/10* (2006.01)
  *H01L 43/12* (2006.01)
  *H01L 33/00* (2010.01)

(58) Field of Classification Search
  CPC ......... H01L 21/02521; H01L 21/02573; H01L 21/02156; H01L 21/02192; H01L 21/02581; H01L 2924/01105; H01F 1/0302
  See application file for complete search history.

(56) References Cited

U.S. PATENT DOCUMENTS

2016/0181093 A1  6/2016  Dargis et al.
2017/0018346 A1* 1/2017  Natali ..................... H01L 43/08

OTHER PUBLICATIONS

Written Opinion of the ISA for PCT/IB2017/057718, dated Feb. 23, 2018, 5 pages.
Natali, F., et al., "Rare-earth mononitrides", Progress in Materials Science, vol. 58, No. 8, 2013, pp. 1316-1360.

* cited by examiner

RARE EARTH NITRIDE STRUCTURES AND DEVICES AND METHOD FOR REMOVING A PASSIVATING CAPPING

CROSS-REFERENCE TO RELATED APPLICATIONS

This application is the U.S. national phase of International Application No. PCT/IB2017/057718 filed 7 Dec. 2017, which designated the U.S. and claims priority to EP Patent Application No. 16202663.7 filed 7 Dec. 2016, the entire contents of each of which are hereby incorporated by reference.

FIELD OF THE INVENTION

The present invention relates to the field of rare earth nitride structures and devices, and a method for producing a rare earth nitride structure or rare earth nitride device including a removable passivating capping, a method for removing a capping for passivating a rare earth nitride material as well as structures produced by these methods and devices including such a structure.

BACKGROUND

The rare earths have atomic numbers from 57 (La) to 71 (Lu), and comprise the elements across which the 4f orbitals are filled: that is, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

They have atomic configurations $[Xe]6s^2 4f^n$, with n varying from 1 for Ce (0 for La) to 14 for Lu, and most of the series have an additional 5d electron. Their most common ionic charge state is 3+, with the 4f levels spanning the Fermi energy.

They are the only stable elements with more than marginally filled f-shell electronic orbitals and, as a consequence, they are the elements with the largest spin and orbital moments.

In ordered solids they contribute to the most strongly ferromagnetic materials, a contribution that has ensured their utility in technologies that require strong permanent magnets.

Despite their name they are by no means rare, with the exception of promethium, which has no stable nuclear isotope.

The rare earth nitrides were first investigated in the 1960s, when technological developments overcame the problems faced in separating the chemically similar members of the lanthanide series. The rare earth nitrides are almost all ferromagnetic with magnetic states that vary strongly across the series and coercive fields depending strongly on the growth conditions.

The rare earth nitrides are almost all semiconductors with an optical bandgap typically of the order of 1 eV. The rare earth nitrides are almost all ferromagnetic semiconductors.

The rare earth nitrides show promise in applications as diverse as spintronics, infrared (IR) detectors, and as contacts to group III-nitride semiconductor compounds. For example, rare earth nitrides have been used in the fabrication of spin-filter Josephson junctions, magnetic tunnel junctions and field effect transistor structures.

The rare earth nitrides, however, have the propensity to decompose and oxidise. To overcome this, thin films of rare earth nitrides on a substrate are generally passivated with an effective capping layer to avoid reaction with the ambient atmosphere.

A series of polycrystalline or amorphous capping layers have been tried successfully in the past and reported in the literature ("Rare-earth mononitrides", Prog. Mater. Sci., vol. 58, no. 8, pp. 1316-1360, 2013), including metallic layers such as W, Cr, Cu, TaN, NbN and insulator films such as yttria stabilized zirconia (YSZ), GaN, AlN and MgF.

Polycrystalline AlN and GaN are the most commonly used capping layers which can be attributed to their transparency allowing optical measurements, their ease of growth, and good chemical stability over time.

WO 2015/152736, WO 2015/152737 and US2016/181093 disclose capping layers for thin films of rare earth nitrides to avoid reaction with the ambient atmosphere.

There is, however, a demand for capping layers that can be removed in vacuum for various fundamental characterisation techniques, including for example synchrotron-based measurements for electronic structure and surface science tools for morphology characterisation.

There is also a demand for subsequent use of rare earth nitrides thin films or structures by customers or users wishing to subsequently form their own spintronic or optoelectronic devices. This includes, for example, the growth of subsequent rare-earth nitrides thin films, group III nitrides thin films, topological insulator layers, and nanofabrication aspects (patterning, etching, contact deposition).

However, the removal of the above-mentioned capping layers, including those mentioned in WO 2015/152736, WO 2015/152737 and US2016/181093, can generate significant undesirable structural and surface modification of the underlying rare-earth nitride material or modification of the electrical and/or optical characteristics of the underlying rare-earth nitride material.

As a result, fundamental characterisation is often of very limited interest. It additionally significantly limits the subsequent use of the rare earth nitrides thin films or structures.

SUMMARY

It is therefore one aspect of the present disclosure to provide a structure or device that overcomes the above problems.

The structure or device preferably includes a rare earth nitride material, and a removable capping for passivating the rare earth nitride material. The removable passivating capping includes or consists of samarium, europium, thulium, antimony, bismuth, zinc, arsenic, silver, strontium, cadmium, calcium, lead, sodium, or tellurium; or consists solely of indium.

The structure or device preferably includes a rare earth nitride material, and a removable capping for passivating the rare earth nitride material. The capping is a removable capping that is removable without modification of the electrical and/or optical characteristics of the rare-earth nitride material.

According to another aspect of the present disclosure, the structure or device preferably includes a rare earth nitride material, and a removable capping for passivating the rare earth nitride material. The capping is a metal-based capping removable by evaporation or sublimation under vacuum at a temperature below 600° C. and above 200° C. at a pressure of $1 \times 10^{-4}$ Torr or $1.33 \times 10^{-2}$ Pa, or under vacuum at a temperature below 500° C. and above 100° C. at a pressure of $1 \times 10^{-8}$ Torr or $1.33 \times 10^{-6}$ Pa.

According to another aspect of the present disclosure, the structure or device preferably includes a rare earth nitride material, and a removable capping for passivating the rare earth nitride material. The capping is removable without modification of the bulk structural properties or bulk properties of the rare-earth nitride material.

According to another aspect of the present disclosure, the structure or device preferably includes a rare earth nitride material, and a removable capping for passivating the rare earth nitride material. The capping is removable to produce a change of less than 1%, or less than 0.5%, or less than 0.1% or less than 0.05% in a lattice constant of the rare earth nitride material.

According to still another aspect of the present disclosure, the capping is removable without modification of the bulk structural properties of the rare-earth nitride material.

According to yet another aspect of the present disclosure, the removable passivating capping includes or consists of samarium, europium, thulium, antimony, bismuth, zinc, arsenic, silver, strontium, cadmium, calcium, lead, sodium, or tellurium; or consists solely of indium.

In one embodiment, the capping is an epitaxial capping layer.

In another embodiment, the capping is a polycrystalline or amorphous capping layer.

According to another aspect of the present disclosure, the rare earth nitride material includes or consists of a rare earth nitride selected from the following group: lanthanum nitride (LaN), praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), lutetium nitride (LuN);

and/or the rare earth nitride material includes or consists of a rare earth nitride alloy of any two or more of the rare earth nitrides selected from the following group: lanthanum nitride (LaN), praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), lutetium nitride (LuN).

According to yet another aspect of the present disclosure, the rare earth nitride material is doped with at least one element that is beryllium, magnesium, calcium, strontium, barium or radium.

According to another aspect of the present disclosure, the rare earth nitride material includes at least one layer or multiple successive layers, the at least one layer or multiple layers comprising or consisting of a rare earth nitride and/or an alloy of rare earth nitrides.

In one embodiment, the structure or device includes a substrate or template, the rare earth nitride material being located on the substrate or template or in direct contact with the substrate or template.

In another embodiment, the structure or device includes a substrate or template, and at least one additional optical or electrical active layer located between the substrate or template and the rare earth nitride material.

According to yet another aspect of the present disclosure, a method for producing a rare earth nitride structure or rare earth nitride device including a removable passivating capping is provided. The method includes the steps of:
    providing a rare earth nitride material; and
    depositing a removable capping for passivating the rare earth nitride material;

wherein the capping is removable without modification of the electrical and/or optical characteristics of the rare-earth nitride material.

According to another aspect of the present disclosure, a method for removing a capping for passivating a rare earth nitride material is provided. The method includes the steps of:
    providing a structure or device comprising a rare earth nitride material and a removable capping for passivating the rare earth nitride material; the capping being removable without modification of the electrical and/or optical characteristics of the rare-earth nitride material; and
    removing the capping by evaporation or sublimation under a vacuum.

According to another aspect of the present disclosure, the present invention concerns structures produced by the above methods and devices including such a structure.

The above and other objects, features and advantages of the present invention and the manner of realizing them will become more apparent, and the invention itself will best be understood from a study of the following description with reference to the attached drawings showing some preferred embodiments of the invention.

A BRIEF DESCRIPTION OF THE SEVERAL VIEWS OF THE DRAWINGS

Herein, identical reference numerals are used, where possible, to designate identical elements that are common to the figures.

DETAILED DESCRIPTION OF SEVERAL EMBODIMENTS

Figure 1A:
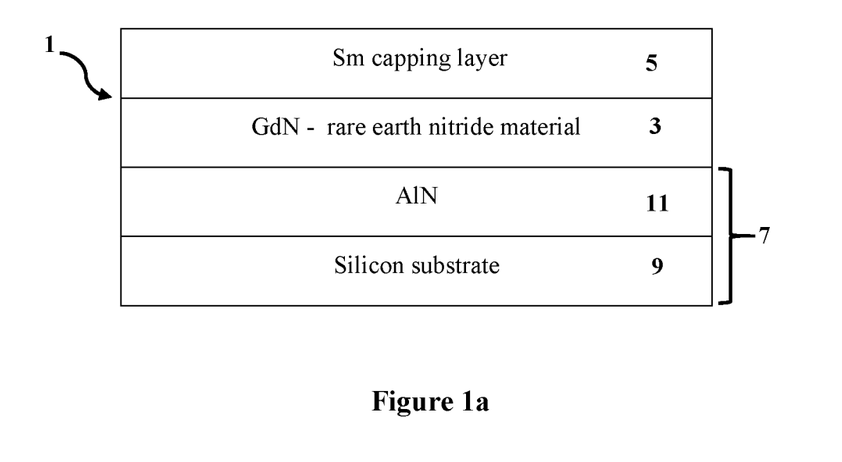
FIG. 1a schematically shows an exemplary structure or device according to one aspect of the present invention.

FIG. 1a schematically shows an exemplary structure or device 1 according to one embodiment. The structure or device 1 includes a rare earth nitride (REN) material 3, and a removable capping 5 for passivating the rare earth nitride material 3. In FIG. 1a, the rare earth nitride (REN) material 3 is for example GdN, and the removable capping 5 is a Sm capping.

The exemplary illustrated structure 1 further includes a template 7 comprising a substrate 9 and deposition layer 11. The rare earth nitride material 3 is located on the deposition layer 11 of the template 9 and in direct contact with the deposition layer 11 of the template 7.

The template 7 can be replaced by a substrate 9. The rare earth nitride material 3 is thus alternatively located on or deposited on the substrate 9 and in direct contact with the substrate 9.

The capping 5 can be removed from the rare earth nitride material 3 without the electrical and/or optical characteristics of the rare-earth nitride material 3 being (substantially) changed or modified.

Furthermore, the capping 5 can be removed from the rare earth nitride material 3 without the rare-earth nitride material 3 being structurally changed or modified, that is, without the bulk properties or bulk structural properties of the rare-earth nitride material 3 being (substantially) changed or modified.

For example, the lattice constant (for example, the out-of-plane lattice constant) for the rare earth nitride material or layer 3 before removal of the capping layer or material 5 when compared to the lattice constant for the rare earth nitride material or layer 3 after removal of the capping layer or material 5 undergoes a change of less than 1%, or less than 0.5%, or less than 0.1% or less than 0.05%, The lattice constant after removal is measured, for example, without exposure of the rare earth nitride material or layer 3 to the ambient atmosphere once the capping material or layer 5 according to the present disclosure is removed.

The lattice constant is measured, for example, after a new capping layer or material (or any material or layer is provided on the exposed rare earth nitride material or layer 3 to provide protection from the ambient atmosphere) is again provided on the exposed rare earth nitride material or layer 3 after removal of the capping 5 material or layer according to the present disclosure. The replacement capping layer or material can be any capping layer or material suitable for the rare earth nitride material or layer 3. The lattice constant can be measured, for example, after exposure of the newly capped rare earth nitride material or layer 3 to the ambient atmosphere.

The lattice constant (for example, the out-of-plane lattice constant) is measured, for example, by x-ray diffraction using an omega-2theta scan.

The bulk properties of the rare earth nitride material 3 remain unchanged when the capping 5 is removed from the rare earth nitride material 3.

The capping 5 can, for example, be removed by evaporation or sublimation under a vacuum, including an ultra-high vacuum.

The removable passivating capping or capping layer 5 includes or consists solely of samarium, or europium, or thulium, or antimony, or bismuth, or zinc, or arsenic, or silver, or strontium, or cadmium, or calcium, or lead, or sodium, or tellurium; or consists solely of indium.

The removable passivating capping 5 is thus a samarium capping, a europium capping, a thulium capping, a solely indium capping, an antimony capping, a bismuth capping, a zinc capping, an arsenic capping, a silver capping, a stron-tium capping, a cadmium capping, a calcium capping, a lead capping, a sodium capping, or a tellurium capping.

The capping or capping layer 5 is, for example, a metal-based capping or capping layer (non-binary nor ternary alloys such as ZnO or GaN) with preferably a low evaporation/sublimation temperature (meaning the temperature at which the onset of evaporation/sublimation starts). For example, below 600° C. and above 200° C. at a pressure exerted on the capping of (about) $1\times10^{-4}$ Torr or $1.33\times10^{-2}$ Pa, or below 500° C. and above 100° C. at a pressure of (about) $1\times10^{-8}$ Torr or $1.33\times10^{-6}$ Pa.

The capping layer 5 may be epitaxial with doped rare earth nitride material or rare earth nitride material. The capping layer 5 may be polycrystalline, or amorphous with doped rare earth nitride material or rare earth nitride material.

The capping 5 can be thus an epitaxial capping layer or a polycrystalline or amorphous capping layer.

The capping or capping layer thickness is preferably between about 1 to 200 nm, for example, between 120 to 150 nm or about 40 to 50 nm. It is preferably as thin as possible but thicknesses greater than 200 nm will also technically work.

The rare earth nitride is selected, for example, from the group consisting of lanthanum nitride (LaN), praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), and lutetium nitride (LuN), and alloys of any two or more thereof.

The rare earth nitride material 3 can include or consist solely of a rare earth nitride selected from the following group: lanthanum nitride (LaN), praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), lutetium nitride (LuN).

The rare earth nitride material 3 can include or consist solely of lanthanum nitride (LaN), or praseodymium nitride (PrN), or neodymium nitride (NdN), or samarium nitride (SmN), or europium nitride (EuN), or gadolinium nitride (GdN), or terbium nitride (TbN), or dysprosium nitride (DyN), or holmium nitride (HoN), or erbium nitride (ErN), or thulium nitride (TmN), or ytterbium nitride (YbN), or lutetium nitride (LuN).

The rare earth nitride material 3 can additionally include a rare earth nitride alloy of any two or more of the rare earth nitrides selected from the following group: lanthanum nitride (LaN), praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), lutetium nitride (LuN).

The rare earth nitride material 3 can alternatively include or consist solely of rare earth nitride alloys of any two or more of the rare earth nitrides selected from the following group: lanthanum nitride (LaN), praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), lutetium nitride (LuN).

The rare earth nitride material 3 can additionally include a rare earth nitride alloy of any two or more of the rare earth nitrides lanthanum nitride (LaN), or praseodymium nitride (PrN), or neodymium nitride (NdN), or samarium nitride (SmN), or europium nitride (EuN), or gadolinium nitride (GdN), or terbium nitride (TbN), or dysprosium nitride (DyN), or holmium nitride (HoN), or erbium nitride (ErN), or thulium nitride (TmN), or ytterbium nitride (YbN), or lutetium nitride (LuN).

The rare earth nitride material 3 can alternatively include or consist solely of rare earth nitride alloys of any two or more of the rare earth nitrides lanthanum nitride (LaN), or praseodymium nitride (PrN), or neodymium nitride (NdN), or samarium nitride (SmN), or europium nitride (EuN), or gadolinium nitride (GdN), or terbium nitride (TbN), or dysprosium nitride (DyN), or holmium nitride (HoN), or erbium nitride (ErN), or thulium nitride (TmN), or ytterbium nitride (YbN), or lutetium nitride (LuN).

The rare earth nitride material 3 can be doped with chemical elements from column/group II in the periodic table consisting of beryllium, magnesium, calcium, strontium, barium and radium.

The rare earth nitride material 3 can for example be made of one or more successive layers of rare earth nitride layers or alloys.

The rare earth nitride material or the doped-rare earth nitride material is a thin film. The film thickness is typically about 1 to 2000 nm.

The rare earth nitride material 3 can include or consist of at least one layer or multiple successive layers.

The at least one layer or the multiple layers comprises or consists of a rare earth nitride and/or an alloy of rare earth nitrides and are thus rare earth nitride layers and can optionally be doped rare earth nitride layers.

The rare earth nitride material 3 can be for example a supperlatice upon which the capping layer 5 is directed deposited or located.

The doped or non-doped rare earth nitride material 3 can be an epitaxial layer. Alternatively, the doped or non-doped rare earth nitride material 3 can be a polycrystalline or amorphous layer.

The structure or device 1 can be an epitaxial structure or device, polycrystalline structure or device or amorphous structure or device. The structure or device 1 can be a multilayer structure or multilayer device and may be an epitaxial multilayer structure or multilayer device, polycrystalline multilayer structure or multilayer device or amorphous multilayer structure or multilayer device.

However, the structure 1 is not limited to the illustrated embodiment of FIG. 1 and could be made of or further include many kind of different materials, for example heterostructures, upon which the top layer is a rare-earth nitride material 3 requiring a capping layer 5. For example, one or more layers or materials of different materials, which may or may not include rare earth nitrides, are present between the template 7 or substrate 9 and the rare earth nitride layer or rare earth nitride material 3.

For example, the structure or device 1 can be a spin-light emitting diode (LED), where the LED active part or region can be GaN-based and the spin injection region 3 can be made from a gadolinium nitride layer 3 or include gadolinium nitride. The LED active part or region (that may include one or more layers) is for example present between the template 7 or substrate 9 and the spin injection region 3. A capping layer 5 covers the spin injection region 3 or is in direct contact with the layer or material 3.

The structure or device 1 may thus include at least one additional optical or electrical active layer(s) or region located between the substrate or template and the rare earth nitride material 3.

Figure 1B:
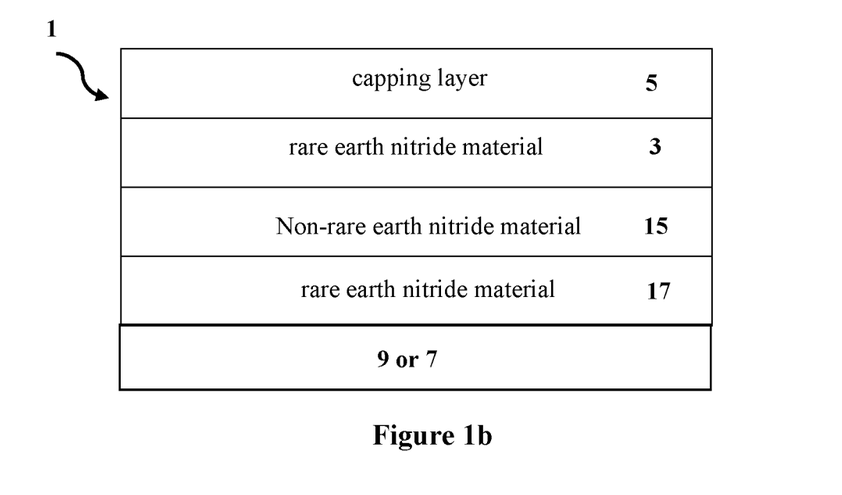
FIG. 1b schematically shows another exemplary structure or device according to another exemplary aspect of the present invention.

Alternatively, the structure or device 1 can be a trilayer superlattice comprising or consisting of a REN material or layer(s) 3/a non-REN material or layer(s) 15/a REN material or layer(s) 17 as shown in FIG. 1*b*. Such a trilayer superlattice forms, for example, a Josephson junction or magnetic tunnel junction.

The capping 5 can also be a capping layer deposited on the rare earth nitride material layer.

It should be understood that the above examples are non-limiting examples and that the present invention concerns any structure or device 1 comprising or consisting of the rare earth nitride material 3 upon which a capping layer 5 is deposited or formed.

A method for producing the rare earth nitride structure 1 or rare earth nitride device 1 including a removable passivating capping 5 includes the steps of providing a rare earth nitride material 3 and depositing a removable capping 5 for passivating the rare earth nitride material 3.

According to one exemplary embodiment, epitaxial gadolinium nitride (GdN) film 3 capped with an epitaxial samarium (Sm) film 5 were grown in a molecular beam epitaxy system equipped with conventional Gd and Sm evaporation cells.

The purity of the as-received Gd and Sm solid charges was 3N. The nitrogen precursor use for the growth of GdN was pure molecular nitrogen ($N_2$) gas. The purity of the $N_2$ was at least 4N.

The growth of the epitaxial GdN 3 and capped with epitaxial Sm film 5 was carried out on a 100 nm to 200 nm thick AlN buffer layer 11 grown on a deoxidized silicon substrate 9 oriented along the (111) plane.

The GdN film 3 was grown at a substrate temperature of 650-700° C., at a growth rate of about 60 nm/hour and under a partial pressure of nitrogen of $1\times10^{-4}$ Torr. The thickness of the GdN film 3 is about 30 nm. The GdN film was capped with an 80 nm thick epitaxial Sm layer to prevent decomposition in air. The Sm layer 5 was grown at room temperature, at typically a temperature of about 30° C. and with a deposition rate of about 150 nm/h. The pressure during the growth was measured to be $1\times10^{-7}$ Torr. The thicknesses of the layers were determined by combined ex-situ measurements including scanning electron microscopy and X-ray reflectivity.

While the capping layer is deposited at ambient temperature in this example, it can alternatively be deposited at elevated temperatures. The value of the elevated temperature is material-dependent.

The REN layer 3 in the above example is epitaxial, however, the layer 3 can be made polycrystalline or amorphous also using this growth process.

Polycrystalline or amorphous REN layers can be obtained, for example, when deposited at room temperature or temperature lower than about 400° C. Polycrystalline or amorphous REN layers can be obtained, for example, when deposited on an polycrystalline or amorphous substrate or template. The subsequent capping layer growth will result in an amorphous or polycrystalline capping layer.

Preferably, the capping layer 5 are metal-based layers. The epitaxial growth is then carried out at room temperature due the high surface diffusion of the metal ad-atoms.

The above example concerns a Sm capping. The other capping layer materials mentioned above can be deposited using vacuum and ultra-high vacuum techniques known to the skilled person in the art. Suitable techniques include, but are not limited to, physical vapour deposition (PVD), including pulsed laser deposition (PLD) and DC/RF magnetron sputtering, thermal evaporation, and molecular beam epitaxy (MBE). Other techniques, including but not limited to metalorganic chemical vapour deposition (MOCVD), may also be used. The capping layer source is substance capable of providing gaseous atoms or molecule at the growth surface. The growth rate is typically about 1 µm/h or lower.

FIG. 1a is a schematic cross-sectional drawing showing the structure of an epitaxial layer of samarium 5 deposited on an epitaxial layer of GdN 3 on a substrate or template, which comprises an AlN buffer layer 11 deposited on silicon 9.

Figure 2:
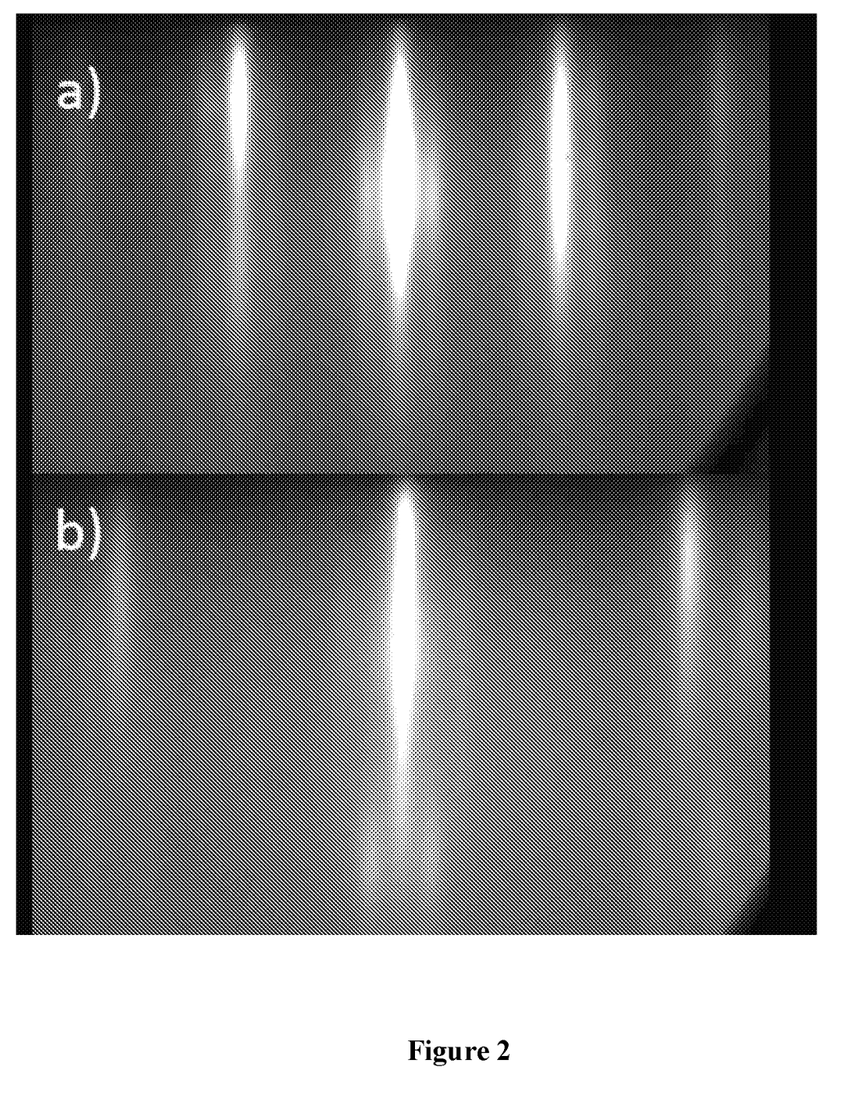
FIG. 2 shows RHEED patterns along (a) the Sm <1-210> direction, (b) Sm <1-100> direction.
Figure 3:
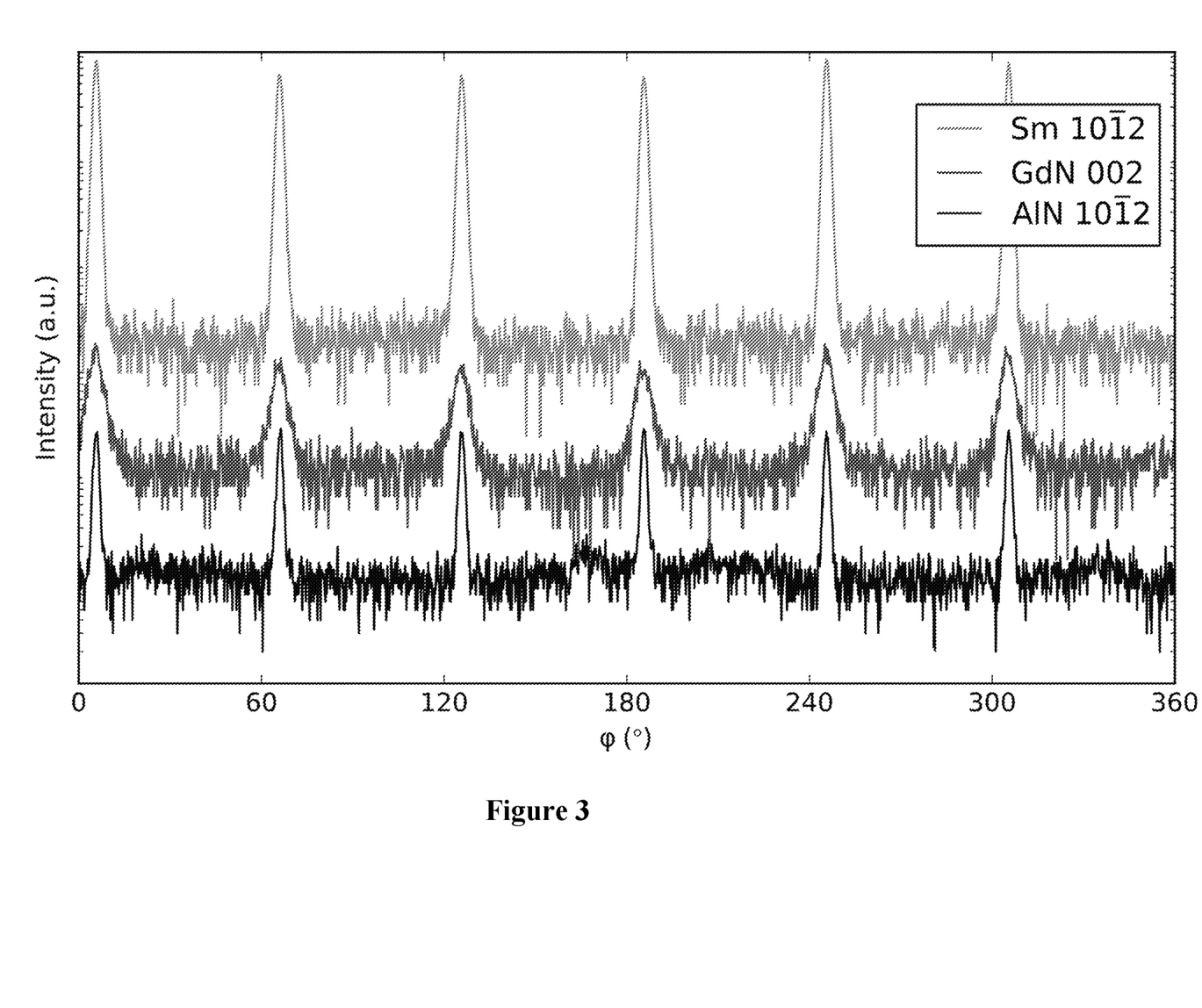
FIG. 3 shows the asymmetric phi-scan of the (10-12) Sm reflection alongside the (10-12) and (002) reflections of the AlN and GdN layers, respectively.

The epitaxial character order/quality of the Sm layer 5 is assessed by reflection high energy diffraction (RHEED) and X-ray diffraction asymmetric phi-scan. FIG. 2 shows RHEED patters along (a) the Sm <1-210> direction, (b) Sm <1-100> and FIG. 3 shows the asymmetric phi-scan of the (102) Sm reflection alongside the (10-12) and (002) reflections of the AlN and GdN layers, respectively. The measurements are carried out at ambient temperature. The epitaxial relationship inferred from those measurements is Sm (0001)||GdN (111)||AlN (0001) and Sm <1-210>|| AlN <1-210>.

The X-ray diffraction asymmetric phi-scan were performed ex-situ after removing the sample from the molecular beam epitaxy system. A part of the sample was then re-introduced in the molecular beam epitaxy system in order to remove the capping layer 5.

The method for removing the capping 5 for passivating the rare earth nitride material 3 includes the steps of providing a structure or device comprising a rare earth nitride material and a removable capping 5 for passivating the rare earth nitride material and removing the capping 5 by for example evaporation or sublimation under a vacuum, including an ultra-high vacuum.

According to one exemplary embodiment, the Sm epitaxial capping layer 5 was removed by heating the sample within an ultra-high vacuum environment. The sample is homogenously heated. The pressure in the vacuum system or chamber was typically about $5 \times 10^{-8}$ Torr. The sample was heated for about 45 minutes at a temperature of 500-550° C.

Figure 4:
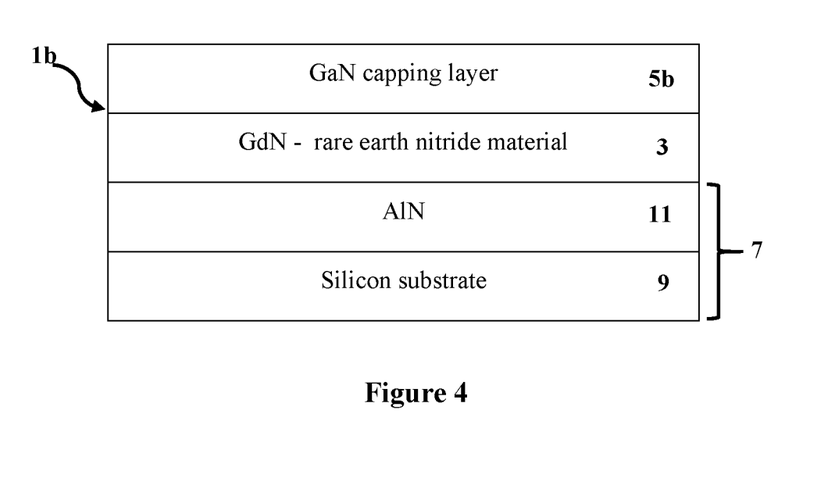
FIG. 4 schematically shows an exemplary structure or device according to one aspect of the present invention.

The pressure in the vacuum system in this specific example was typically about $5 \times 10^{-8}$ Torr. The pressure in the vacuum system is preferably about $10^{-3}$ Torr or lower or more preferably $10^{-5}$ Torr or lower. The sample was cool-down to room temperature to deposit a replacement gallium nitride (GaN) capping layer 5b on the bare/remaining GdN layer 3. The polycrystalline GaN capping layer 5b has a thickness of 40 nm. The new structure 1b is schematically shown on FIG. 4.

The capping layer 5 in the exemplary embodiment is removed after being exposed to air. However, this can be carried out on a structure 1 that has been kept under vacuum or an atmosphere of an inert gas.

The capping layer 5 is removed at high temperature. The temperature corresponds to the temperature of evaporation/sublimation of the material considered or a higher temperature. It is to be noted that the temperature of evaporation/sublimation value chosen is a function of the pressure in the chamber.

The capping layer is removed by evaporation or sublimation taking place in a vacuum or an ultra-high vacuum system. The pressure in the vacuum system is typically about $10^{-3}$ Torr or lower.

The removal process advantageously does not modify the structural or electrical or optical properties of the underneath rare-earth nitride material or layer 3.

The above example concerns the removal of the Sm capping. The removal of the other metal-based cappings previously mentioned is also done by the evaporation/sublimation process. The capping layer is removed by heating the structure.

In all cases (including Sm), heating of the structure is carried out, for example, at a temperature below 600° C. and above 200° C. at a pressure of (about) $1 \times 10^{-4}$ Torr or $1.33 \times 10^{-2}$ Pa exerted on the capping, or at a temperature below 500° C. and above 100° C. at a pressure of (about) $1 \times 10^{8}$ Torr or $1.33 \times 10^{-6}$ Pa.

The present invention also concerns capping-less structure produced by the above removal method, the structure or device produced by the deposition of further layers on this capping-less structure.

Figure 5:
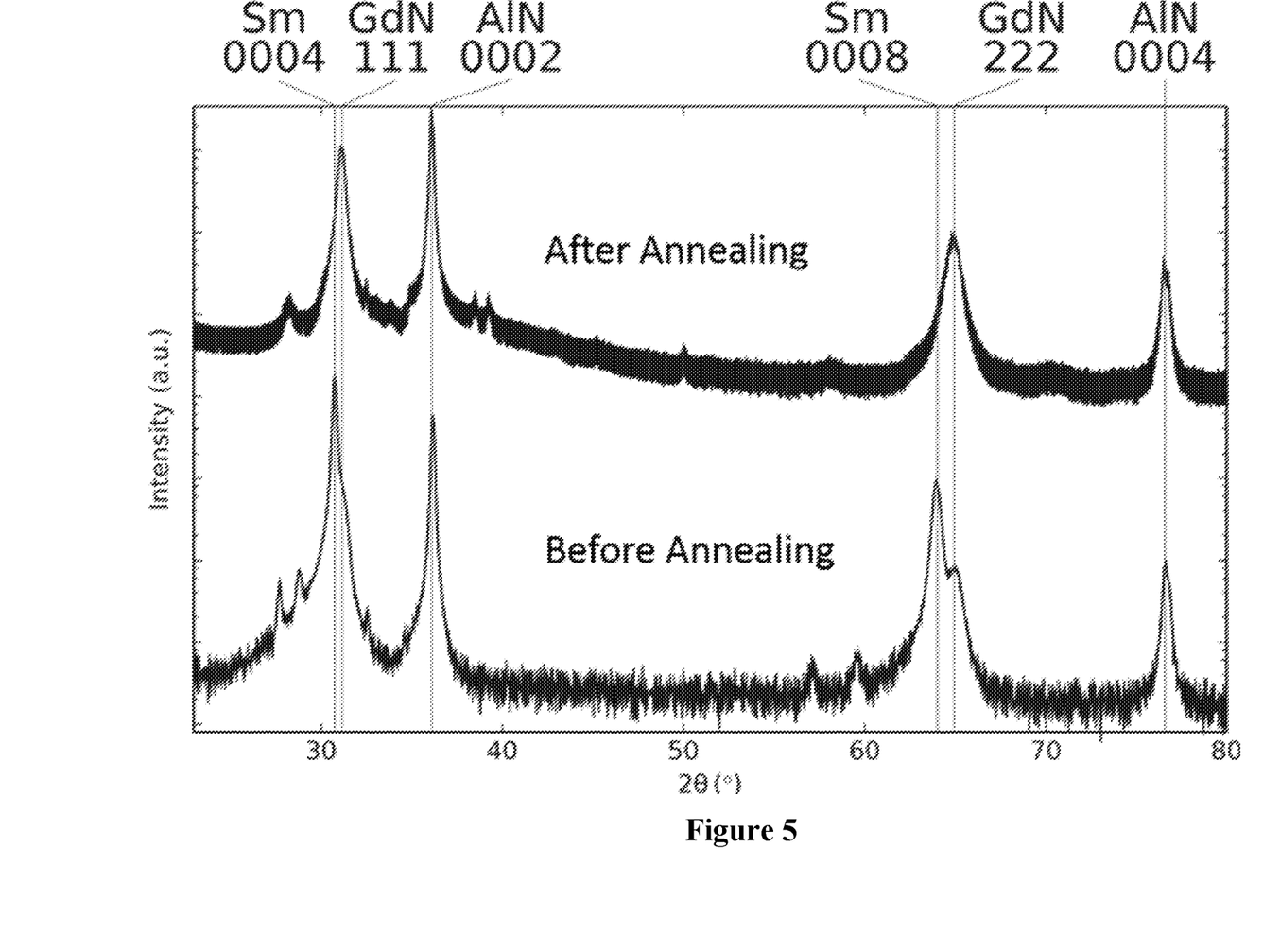
FIG. 5 shows omega-2theta scans of an as-grown structure comprising Sm/GdN/AlN/Si(111) (bottom curve) and a structure formed from the initial structure comprising Sm/GdN/AlN/Si(111) for which the Sm capping layer has been removed and the structure recapped with a GaN capping layer (top curve)

FIG. 5 shows omega-2theta scans of an as-grown structure 1 comprising Sm/GdN/AlN/Si(111) (bottom curve) and a structure formed from the initial structure comprising Sm/GdN/AlN/Si(111) for which the Sm capping layer 5 has been removed and recapped with a GaN capping layer (top curve). The omega-2theta scan of the structure for which the Sm has been removed does not show any peaks and reflections associated with samarium. In addition, the full width at half maximum (FWHM) and angle position of the (111) GdN reflection are comparable before and after the evaporation process.

The out-of plane lattice constant (which is the lattice constant along the direction perpendicular to surface of layer) of the rare earth nitride material GdN with the initial Sm capping layer 5 and then with GaN capping layer was determined using the measured x-ray diffraction data of FIG. 5 obtained using a conventional omega-2theta scan within Bragg-Brentano conditions. Before removal of the Sm capping layer, the lattice constant determined or extracted for GdN is c=0.498560 nm and after removal with the recapped GaN capping layer c=0.498377 nm, or a change as low as of −0.04%, highlighting that the removal process did not (significantly) change the structural parameters of the rare earth nitride material GdN.

Omega-2theta scans can be described, for example, as a process where the angle that diffracted x-rays are detected at (2theta) is varied at twice the rate of the incident angle (Omega) in a symmetric bragg-brentano geometry (such that the scattering vector is always directed perpendicular to the sample surface). Omega-2theta or 2theta-omega specifies which angle the data is plotted against; FIG. 5 is plotted as 2theta-omega.

The equipment used to obtain the data is a PANalytical Xpert Pro diffractometer using Cu Kα radiation with an operating voltage of 45 kV and current of 40 mA.

Measurements are obtained at room temperature, for example, (about) 20° C.

The angle position of the diffraction peaks allows to determine the distance between parallel planes, and thus the lattice constant, within the crystallographic structure by using Bragg's laws. Details of this determination can be found, for example, in Theory of X-Ray Diffraction in Crystals by William H. Zachariasen, Dover Publications, 1995.

For example, the peak center is used to determine the lattice constant, obtained through fitting the data with a peak model such as for example a pseudo-voigt function.

Figure 6A:
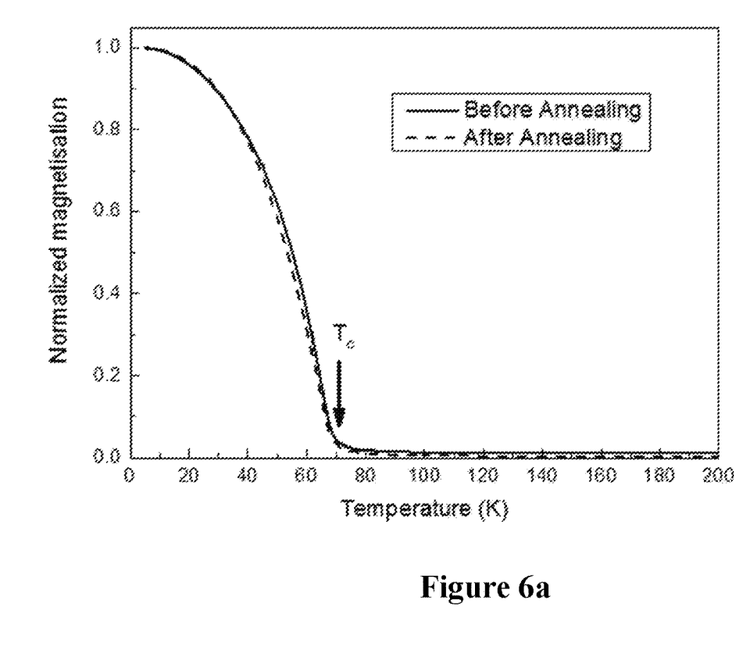
FIG. 6(a) shows the in-plane field-cooled (FC) magnetisation under an applied field of 250 Oe of an as-grown structure comprising Sm/GdN/AlN/Si(111) (solid curve) and a structure formed from the initial structure comprising Sm/GdN/AlN/Si(111) for which the Sm capping layer has been removed and the structure recapped with a GaN capping layer (dash curve)
Figure 6B:
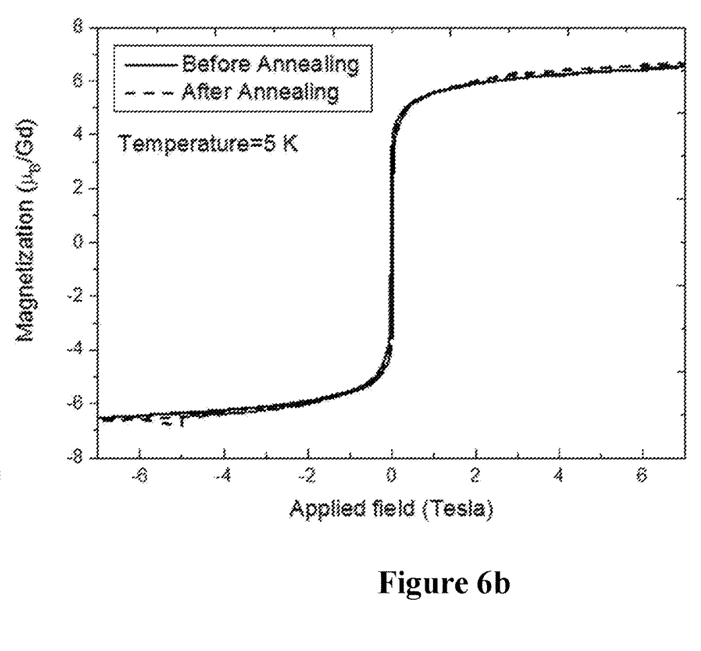
FIG. 6(b) shows the field-dependent magnetisation at 5K of an as-grown structure comprising Sm/GdN/AlN/Si(111) and a structure formed from the initial structure comprising Sm/GdN/AlN/Si(111) for which the Sm capping layer has been removed and the structure recapped with a GaN capping layer.

The magnetization curves shown in FIGS. 6a and 6b confirm that the magnetic properties of the GdN layer 3 in an as-grown structure 1 comprising Sm/GdN/AlN/Si(111) are substantially the same as those of the structure formed from the initial structure comprising Sm/GdN/AlN/Si(111) for which the Sm capping layer 5 has been removed and recapped with a GaN capping layer.

FIG. 6(a) shows the in-plane field-cooled (FC) magnetisation under an applied field of 250 Oe of an as-grown structure comprising Sm/GdN/AlN/Si(111) (solid curve) and the structure formed from the initial structure comprising Sm/GdN/AlN/Si(111) for which the Sm capping layer has been removed and recapped with a GaN capping layer (dash curve). The Curie temperature is about 70K as per GdN thin films.

FIG. 6(b) shows the field-dependent magnetisation at 5K of an as-grown structure comprising Sm/GdN/AlN/Si(111) and the structure formed from the initial structure comprising Sm/GdN/AlN/Si(111) for which the Sm capping layer has been removed and recapped with a GaN capping layer. The magnetic moment is about 6.5 Bohr magneton per gadolinium ion and the coercive field about 250 Oe as per GdN films.

Various aspects of the devices, methods and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments. While the invention has been disclosed with reference to certain preferred embodiments, numerous modifications, alterations, and changes to the described embodiments, and equivalents thereof, are possible without departing from the sphere and scope of the invention. In particular, the features of any one embodiment may be combined with the features of any other embodiment. Accordingly, it is intended that the invention not be limited to the described embodiments, and be given the broadest reasonable interpretation in accordance with the language of the appended claims.

The invention claimed is:

1. A device comprising:
a rare earth nitride material, and
a removable capping for passivating the rare earth nitride material, wherein the removable passivating capping consists solely of samarium, europium, thulium, or indium; or includes or consists solely of antimony, bismuth, zinc, arsenic, silver, strontium, cadmium, calcium, lead, sodium, or tellurium.

2. The device according to claim 1, wherein the capping is an epitaxial capping layer, or the capping is a polycrystalline or amorphous capping layer.

3. The device according to claim 1, wherein the rare earth nitride material includes or consists of a rare earth nitride selected from the following group: lanthanum nitride (LaN), praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), lutetium nitride (LuN).

4. The device according to claim 1, wherein the capping is removable without modification of the bulk structural properties of the rare-earth nitride material.

5. The device according to claim 1, wherein the rare earth nitride material includes at least one layer or multiple successive layers, the at least one layer or multiple layers comprising or consisting of a rare earth nitride and/or an alloy of rare earth nitrides.

6. The device according to claim 1, further including a substrate or template, the rare earth nitride material being located on the substrate or template or in direct contact with the substrate or template.

7. The device according to claim 1, further including a substrate or template, and at least one additional optical or electrical active layer located between the substrate or template and the rare earth nitride material.

* * * * *